(12) United States Patent (10) Patent No.: US 6,246,153 B1
Bishop et al. (45) Date of Patent: Jun. 12, 2001

(54) POSITIVE FEEDBACK RESONANT TRANSDUCER CIRCUIT

(75) Inventors: Richard Patten Bishop, Fairfax Station; Clark Davis Boyd, Hampton, both of VA (US)

(73) Assignee: Face International Corp., Norfolk, VA (US)

( * ) Notice: Subject to any disclaimer, the term of this patent is extended or adjusted under 35 U.S.C. 154(b) by 0 days.

(21) Appl. No.: 09/503,674

(22) Filed: Feb. 14, 2000

Related U.S. Application Data

(63) Continuation-in-part of application No. 09/118,136, filed on Jul. 16, 1998.
(60) Provisional application No. 60/165,864, filed on Nov. 16, 1999.

(51) Int. Cl.$^7$ .................................................. H01L 41/107
(52) U.S. Cl. ...................................... 310/318; 310/316.01
(58) Field of Search .............................. 310/316.01, 318, 310/358

(56) References Cited

U.S. PATENT DOCUMENTS

| | | | | |
|---|---|---|---|---|
| 5,654,605 | * | 8/1997 | Kawashima | 310/316.01 |
| 5,705,877 | | 1/1998 | Shimada | 310/318 |
| 5,969,954 | * | 10/1999 | Zaitsu | 363/16 |
| 6,054,796 | * | 4/2000 | Bishop | 310/316.01 |
| 6,114,797 | * | 9/2000 | Bishop et al. | 310/318 |

* cited by examiner

*Primary Examiner*—Thomas M. Dougherty
(74) *Attorney, Agent, or Firm*—Stephen E. Clark; David J. Bolduc

(57) ABSTRACT

A circuit including a transformer, preferably a laminated piezoelectric transducer, in combination with a positive feedback amplifier circuit, capable of serving: 1) to produce either an audible or ultrasonic signal; or 2) as an energy source capable of driving an auxiliary high voltage device with an initial and continuing low voltage source such as a battery.

5 Claims, 10 Drawing Sheets

POSITIVE FEEDBACK RESONANT TRANSDUCER CIRCUIT

This application is a Continuation-In-Part of U.S. patent application Ser. No. 09/118,136 filed on Jul. 16, 1998 and also claims priority from Provisional Application Ser. No. 60/165,864 filed on Nov. 16, 1999.

FIELD OF THE INVENTION

The present invention relates to a positive feedback amplifier circuit that preferably includes a resonating piezoelectric transformer device. The preferred combined circuit can be used to power an auxiliary high voltage electronic device very efficiently using a low voltage power source, and as a device that emits audible or ultrasonic signals or that acts as a transducer.

BACKGROUND OF THE INVENTION

Resonant transducers or transformers capable of stepping up an input voltage are well known in the art. It is similarly well known that such devices will operate most efficiently, i.e. produce the most or optimum gain, at their resonant frequency. Such resonant transducers are useful in situations where it is necessary or desirable to drive an electronic device with a relatively high voltage, while the only available power supply may be of relatively low voltage. For example, it may be desirable to use a 6 or 9 volt battery, for reasons of compactness or remoteness, to power a device requiring a 120–150 volt input. U.S. patent application Ser. No. 08/864,029 filed May 27, 1997, now U.S. Pat. No. 5,834,882 describes a multilayered, laminated, piezoelectric transformer. U.S. Provisional Application No. 60/165,864 filed Nov. 16, 1999 describes a thickness mode piezoelectric transformer with end-masses. Each of these transformers demonstrates the ability to convert a primary or input voltage V1 to a higher secondary or output voltage V2 through the application of V1 to a first polarized piezoelectric ceramic layer(s) to generate an extensional stress which is then mechanically transmitted to a second tightly adhered polarized piezoelectric ceramic layer(s) which undergoes a similar and proportional extensional stress producing V2. The ratio of the first voltage V1 to the second voltage V2 is a function of the piezoelectric properties of the two layers, the size and geometry of the two disk or plate shaped layers and the size and elasticity of the ceramic layers and other adhesive and pre-stress layers as well as the electrode configuration and polarizing characteristics of the ceramic layers utilized in the devices described in the above-referenced applications. Similarly, the resonant frequency of a particular design of such a device will be determined by the same parameters.

SUMMARY OF THE INVENTION

According to the present invention, there is provided a circuit which preferably incorporates the previously referenced piezoelectric transformers in combination with a positive feedback amplifier circuit to yield a device capable of serving: 1) as an energy source capable of driving an auxiliary high voltage device with an initial low voltage input; or 2) to produce either an audible or ultrasonic signal which may mechanically drive another device.

The resonating (i.e. oscillating) transducer piezoelectrically generates an output ("secondary") voltage of alternatingly positive and negative polarity. In one embodiment, this voltage is stepped up and temporarily stored by a rectifier-capacitor array and subsequently supplemented with voltage from a relatively low voltage make-up battery. A supplemented, stepped up voltage of reversed polarity is then fed back into the "primary" side of the transducer during each half cycle of operation. Sequencing and application of the reverse polarity voltage to the primary side of the transducer is accomplished by an operational amplifier which alternatingly drives a pair of power transistors whose output is communicated to the primary side of the transducer. The described process is repeated, and voltage output from the secondary side of the transducer continues to increase, until the circuit reaches steady state, typically after several cycles of transient operation. As the capacitors or the rectifier-capacitor array become charged, the electrical impedance of the array (and therefore the impedance seen at the secondary side of the transducer) decreases. As the impedance decreases, the voltage gain of the disclosed transducer inherently decreases. The ultimate voltage gain of the circuit can therefore be determined by matching the impedance of the rectifier-capacitor array and the transducer at the desired voltage output/gain.

Alternatively, the oscillating piezoelectric transformer/transducer may operate in a pulsed mode regenerative resonant circuit. In this mode, a voltage pulse is applied to the transformer. This voltage is stepped up and rectified and supplemented with voltage from a relatively low voltage make-up battery and temporarily stored in a capacitor. A trigger circuit senses the voltage at the capacitor and when the voltage reaches a certain level, generates a trigger signal. The trigger signal opens the gate of an SCR, which allows the capacitor to discharge sending another voltage pulse to the "primary" input side of the transformer. The described process is repeated, and voltage output from the secondary side of the transducer continues to increase, until the circuit reaches steady state, typically after several cycles of transient operation.

Accordingly, it is an object of the present invention to provide a positive feedback resonant transducer circuit for generating a relatively high alternating voltage from one or more relatively low direct voltage sources.

It is another object of the present invention to provide a circuit of the character described in which the voltage is stepped up by a piezoelectric transformer.

It is another object of the present invention to provide a circuit of the character described in which the stepped up voltage is fed back into the primary side of the piezoelectric transformer to produce a supplemented stepped up voltage at the secondary side of the transformer.

It is another object of the present invention to provide a circuit of the character described in which the piezoelectric transformer comprises a pair of piezoceramic layers intimately bonded together.

It is another object of the present invention to provide a circuit of the character described in which the piezoelectric transformer comprises a plurality of piezoceramic layers intimately bonded together and vibrating in a thickness mode.

It is another object to provide a modification of the present invention in which the piezoelectric transformer produces an acoustic or ultrasonic signal.

It is another object to provide a modification of the present invention in which the stepped up voltage is used to drive an auxiliary high voltage device.

It is another object to provide a modification of the present invention in which the vibration of the transducer / transformer is used to mechanically vibrate an auxiliary device.

Further objects and advantages of my invention will become apparent from a consideration of the drawings and ensuing description thereof.

DESCRIPTION OF THE DRAWINGS

FIG. 7 is a graph of input voltage to output voltage phase angle difference for the piezoelectric transformer shown in FIG. 2.

DETAILED DESCRIPTION OF THE INVENTION

According to the present invention, there are provided electrical circuits which incorporate a transformer or resonant transducer, Including a laminated transducer, and more preferably a Thickness Mode Piezoelectric Transformer (TMPT), in combination with a positive feedback amplifier circuit to yield a device capable of serving: 1) as a constant, very low loss, energy source capable driving an auxiliary high voltage device with a low input voltage; or 2) to produce either an audible or ultrasonic signal which mechanical energy may be further applied to mechanically drive an auxiliary device.

Figure 1:
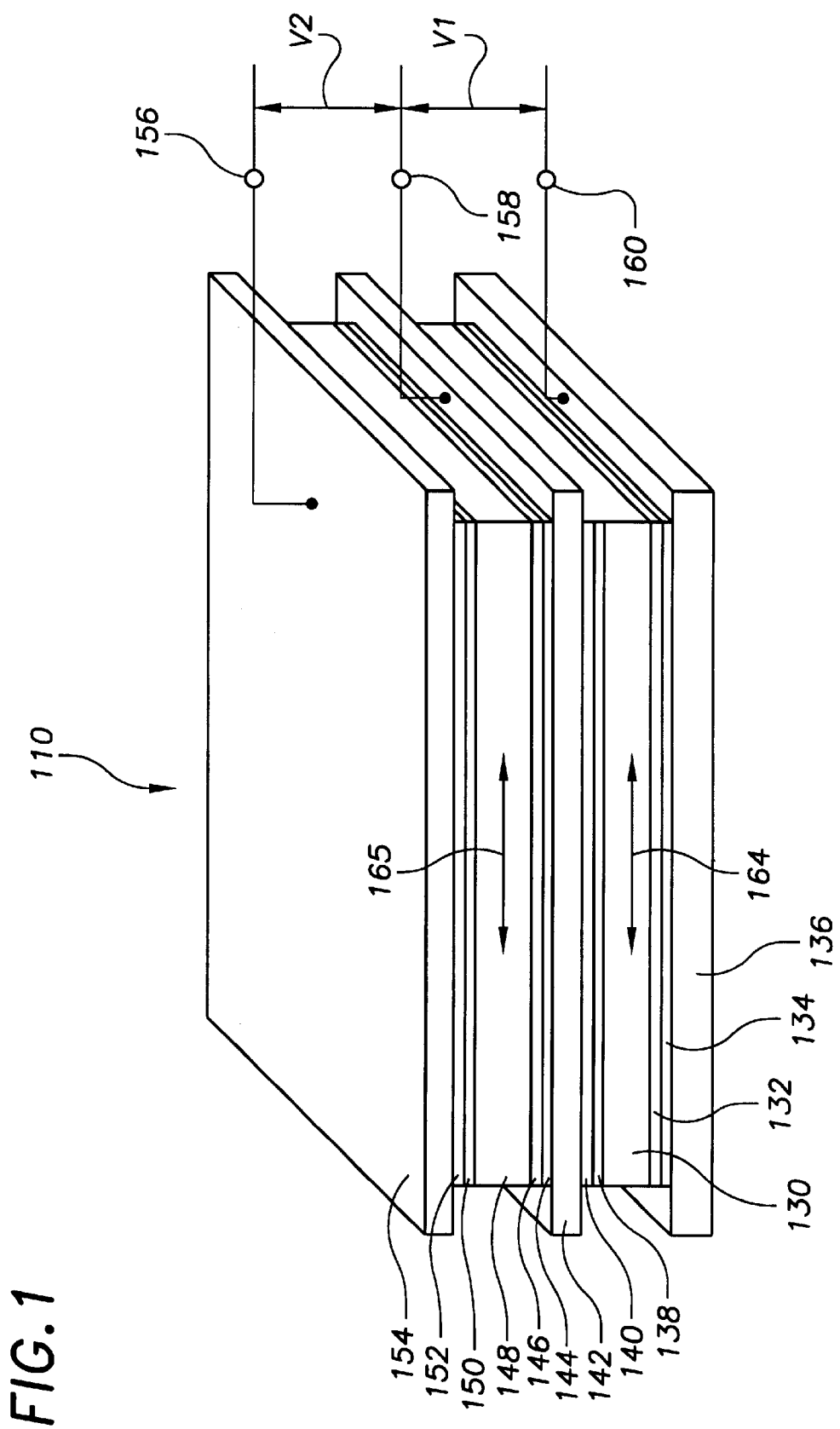
FIG. 1 is a perspective view of a piezoelectric transformer used in the circuits of the present invention.

As shown in FIG. 1, a piezoelectric transformer 110 used in the circuit of the present invention, is manufactured by stacking and bonding together a number of laminate layers. A first piezoelectric ceramic wafer 130 is preferably in the form of a slab having two substantially parallel major faces 132 and 138 that are each electroplated. A second piezoelectric ceramic wafer 148 is preferably in the form of a slab having two substantially parallel major faces 146 and 150 that are each electroplated.

A first pre-stress layer 136 is positioned adjacent one electroplated surface 132 of the first piezoelectric ceramic wafer 130. An adhesive layer 134 is disposed between the first pre-stress layer 136 and the adjacent electroplated surface 132 of the first piezoelectric ceramic wafer 130 for purposes of bonding the two members together. The first pre-stress layer 136 is preferably of a conductive material, preferably a metal, having a coefficient of thermal expansion/contraction which is greater than that of the material of the first ceramic wafer 130.

A second pre-stress layer 142 is positioned adjacent the other electroplated surface 138 of the first piezoelectric ceramic wafer 130. An adhesive layer 140 is disposed between the second pre-stress layer 142 and the adjacent electroplated surface 138 of the first piezoelectric wafer 130 for purposes of bonding the two members together. The second pre-stress layer 142 is preferably a conductive material, preferably a metal, having a coefficient of thermal expansion/contraction which is greater than that of the material of the first ceramic wafer.

An electroplated surface 146 of the second piezoelectric ceramic wafer 148 is positioned adjacent the second pre-stress layer 142, such that the second pre-stress layer 142 is between the two ceramic wafers 130 and 148, as shown in FIG. 1. An adhesive layer 144 is disposed between the second pre-stress layer 142 and the adjacent electroplated surface 146 of the second piezoelectric ceramic wafer 148 for purposes of bonding the two members together. The first pre-stress layer 136 preferably has a coefficient of thermal expansion/contraction greater than that of the material of the second ceramic wafer 148. A third pre-stress layer 154 is positioned adjacent the other electroplated surface 150 of the second piezoelectric ceramic wafer 148. An adhesive layer 152 is disposed between the third pre-stress layer 154 and the adjacent electroplated surface 150 of the second piezoelectric ceramic wafer 148 for purposes of bonding the two members together. The third pre-stress layer 154 is preferably of a conductive material, preferably a metal, having a coefficient of thermal expansion/contraction greater than that of the material of the second ceramic wafer 148.

During manufacture of the transformer 110 the entire stack of laminate layers are arranged as described hereinabove and as illustrated in FIG. 1, and simultaneously heated to a temperature above the melting point of the adhesive layers 134, 140, 144, and 152.

Preferred such adhesive materials are described in greater detail in aforementioned U.S. patent application Ser. No. 08/864,029 which is incorporated herein by reference, but suffice it to say that other adhesive materials may be used so long as they have a melting point below that of the other laminate layers of the transformer, are capable of hardening to apply a bond between the respective pre-stress layers 136, 142, and 154 and the ceramic wafers 130, and 148 sufficient to transfer longitudinal stresses between adjacent layers when electrical current is applied to the transformer and longitudinal expansion of the input ceramic wafer occurs.

After the entire stack of laminate layers has been heated to a temperature above the melting point of adhesive materials 134, 140, 144, and 152, the entire stack is then permitted to cool to ambient temperature. As the temperature of the laminate layers falls below the solidification point of the four adhesive layers, these layer solidify, bonding them to the adjacent layers. During the cooling process, the ceramic wafers 130 and 148 become compressively stressed along their longitudinal axes due to the relatively higher coefficients of thermal contraction of the materials of construction of the pre-stress layers 136, 142, and 154. Thus, piezoelectric transducer 1 assembled as just described comprises a pair of longitudinally pre-stressed (i.e. compressed) piezoelectric ceramic wafers which are intimately bonded to each other, (albeit in the preferred embodiment of the invention separated by laminate adhesive and pre-stress layers), along one of their major faces.

In a preferred embodiment, the pre-stress layers 136, 132 and 154 and the four adhesive layers 134, 140, 144, and 152 are longer than the two ceramic wafers 130 and 148 and, accordingly, protrude beyond the ends of the ceramic wafers. Electrical terminals 156, 158 and 160 are connected, e.g. by wire and solder or other common means of attachment, to an exposed surface of the pre-stress layers 154, 142, and 136 respectively.

In the preferred embodiment, the three pre-stress layers and the four adhesive layers each compressively stress the two ceramic wafers. This compression makes the relatively fragile ceramic wafers less susceptible to damage by cracking and breaking.

After final assembly, each of the ceramic wafers 130 and 148 is electrically polarized in one direction. By this is meant that each of the ceramic wafers 130 and 148 is polarized such that when a voltage potential is applied across corresponding electrodes 146 and 150 or 132 and 138 on its respective major faces, the ceramic wafer will strain longitudinally (i.e. substantially parallel to the planes of the major faces). Conversely, after polarizing, when either of the ceramic wafers is longitudinally strained (i.e. in the plane of their major faces) a voltage potential will be generated between the corresponding electrodes 146 and 150 or 132 and 138 on its respective major faces.

It will therefore be understood that application a first voltage V1 across electroplated major surfaces 132 and 138 of first ceramic wafer 130 will cause ceramic wafer 130 to longitudinally strain, which, in turn, causes second ceramic wafer 148 to longitudinally strain a substantially like amount, which, in turn, causes the production of a second voltage V2 between electroplated major surfaces 146 and 150 of the second ceramic wafer 148. The magnitude of the piezoelectrically generated voltage V2 depends upon the piezoelectric properties of the wafer material 148, the size, geometry and polarization characteristics of the wafer material, as well as the elasticity of the other laminate materials.

Figure 2:
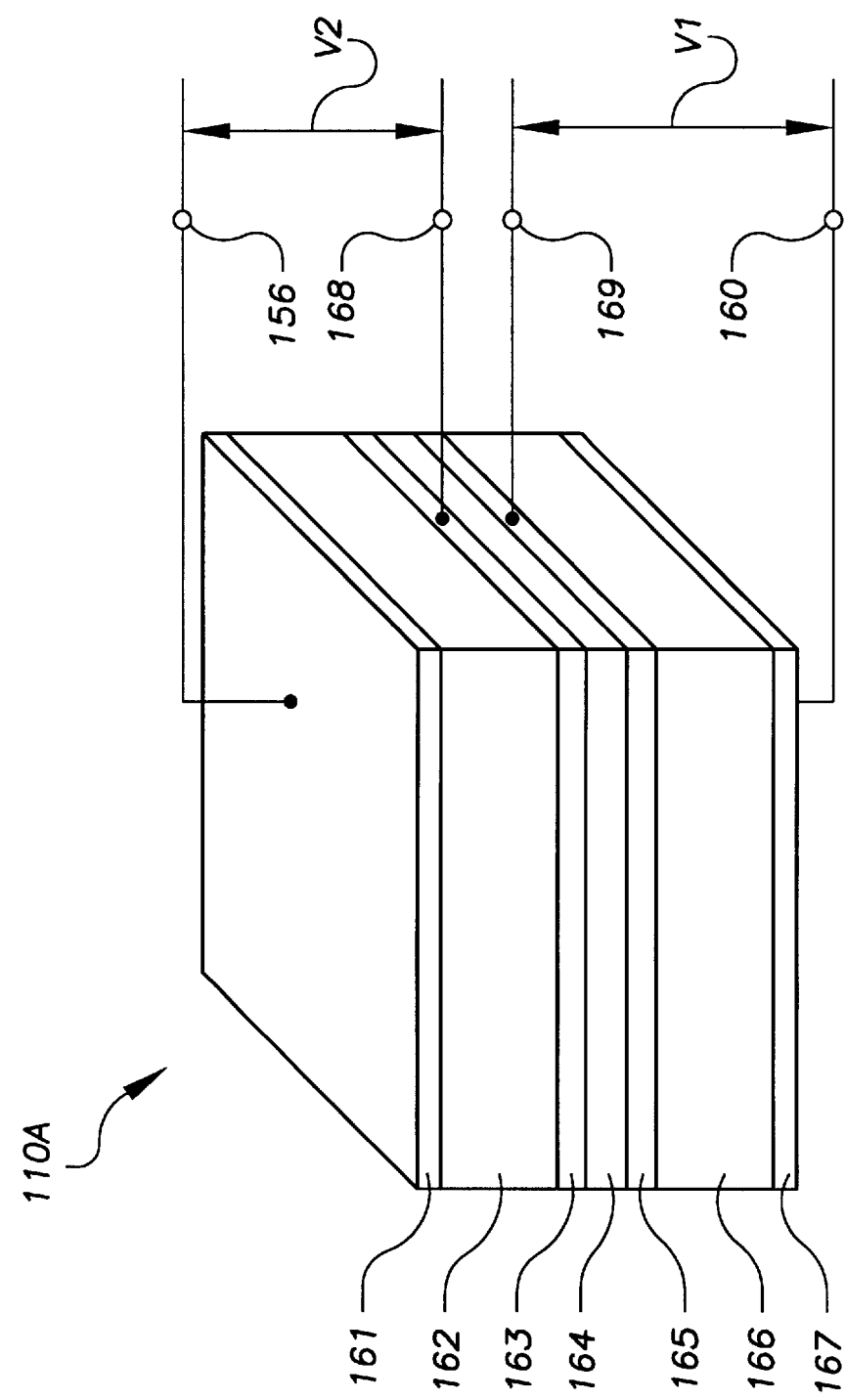
FIG. 2 is a perspective view of a modified piezoelectric transformer used in the circuits of the present invention.

While, according to the preferred embodiments just described, the transformer device of the present invention includes prestressing layers, which are attached within the device by means of adhesive layers, it is also possible and, indeed in some situations most desirable, to construct a device without prestressing layers and without any adhesive. In the case of such a device, the adhesive and prestressing layers can be omitted entirely and the ceramic layers cofired, pressed or ultrasonically welded together to provide the means for the requisite transfer of energy. In such a device, except for elimination of the prestress and adhesive layers, all other layers, i.e. means for attaching electrodes, etc, remain the same. FIG. 2 shows a modified multi-layer piezoelectric transformer 110A which may alternatively used in conjunction with the present invention. In the multi-layer piezoelectric transformer 110A of FIG. 2, a first piezoceramic layer 162 is provided with electrodes 161 and 163 on two of its opposing faces; and second piezoceramic layer 166 is provided with electrodes 165 and 167 on two of its opposing faces. The two electroded piezoceramic layers 162 and 166 are bonded together (for example, by adhesive layer 164). The two electroded piezoceramic layers 162 and 166 are electrically polarized between the opposing electrodes of the respective layers. Terminals 156, 168, 169 and 160 may be provided for electrical connection to the respective electrodes 161, 163, 165 and 167. The two intermediate facing electrodes (i.e. electrodes 163 and 165) may be electrically isolated or electrically connected to each other, depending or whether or not electrical isolation of the "primary" and "secondary" sides of the transformer 110A is desired.

Figure 3:
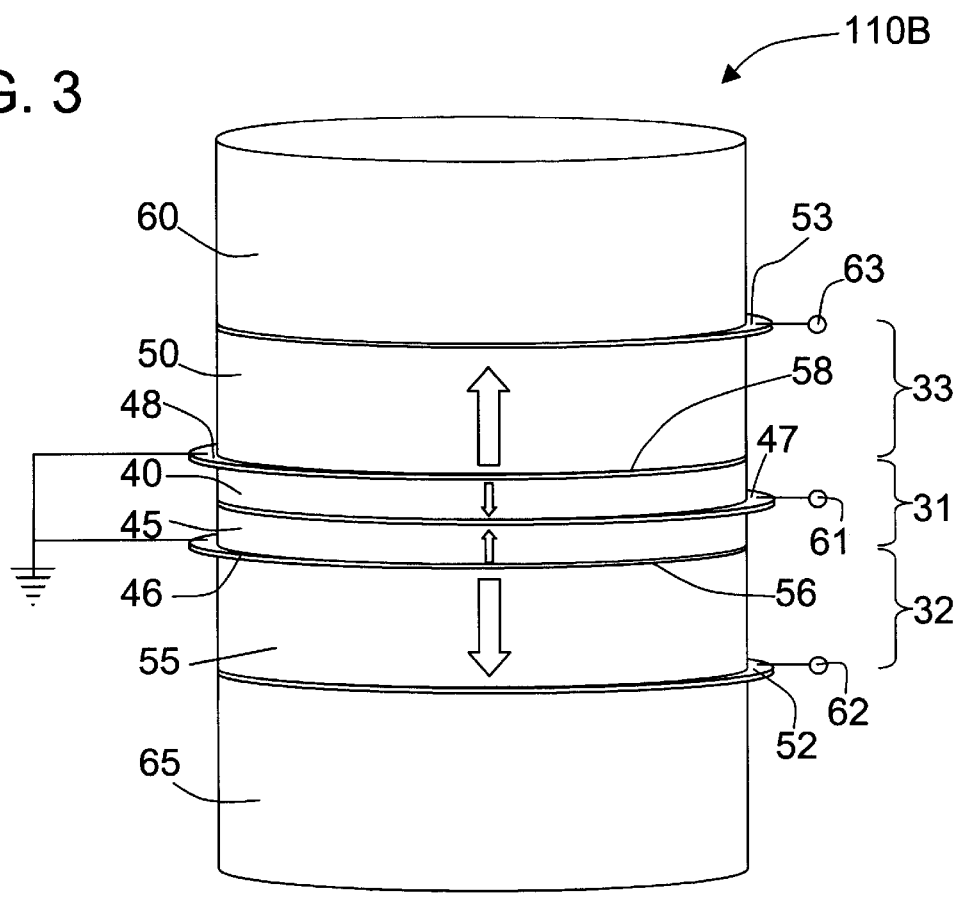
FIG. 3 is a perspective view of a cylindrical thickness mode piezoelectric transformer used in the circuits of the present invention.
Figure 4:
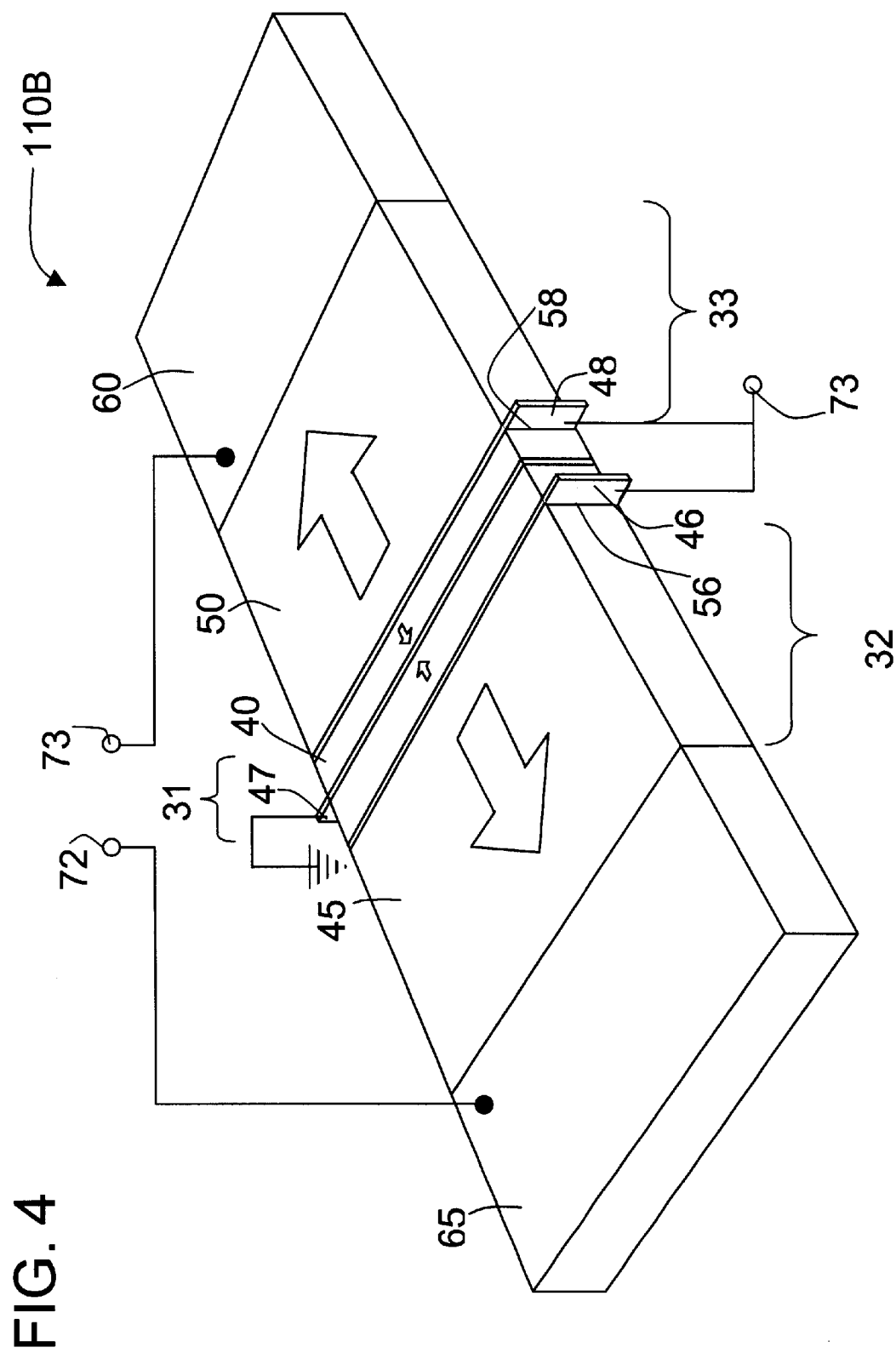
FIG. 4 is a perspective view of a bar-shaped thickness mode piezoelectric transformer used in the circuits of the present invention.

Referring now to FIGS. 3 and 4: In an alternate embodiment of the present invention, a multilayer piezoelectric transformer 110B is provided using thickness mode resonant vibration. An end-mass is bonded to the output ceramic layer. This may be alternatively viewed as replacement of a portion of the output ceramic layer with an end-mass. The end-mass provides a piezoelectric transformer operating at a lower frequency, with higher gain and higher power density than a piezoelectric transformer of the same size using simply a thick output ceramic layer.

Typical thickness mode piezoelectric transformers (TMPTs) utilize a multilayer construction in attempting to provide greater voltage gain and power to circuit applications. The transformation ratio is typically substantially proportional to the square of the impedance ratio of the input and output portions. There is however a practical limit to the efficacy of added ceramic layers and after a certain point, additional ceramic layers do not contribute to the gain of the TMPT. In the present invention it has been found that the addition of end-masses to the output portion(s) of a TMPT may effectively raise the gain achievable in a TMPT.

The output power P of piezoelectric transformer operating in thickness-extensional mode vibration is expressed, based on a simplified consideration from the viewpoint of energy, approximately as:

$$P f_r V \cdot {}_{33}{}^{s} \cdot k_t \text{-} P/QM$$

where $f_r$ is thickness-extensional mode resonance frequency, $_{33}{}^{s}$ is constraint dielectric constant, V is volume of the piezoelectric transformer, $k_t$ is electromechanical coupling coefficient of thickness-extensional mode vibration, and $Q_M$ is the mechanical quality factor. Thus, in a TMPT the power output per unitary volume (power density) increases with greater electromechanical coupling coefficient $k_t$ and higher resonant frequency $f_r$ of piezoelectric ceramic resonator. By increasing the mechanical quality factor of the piezoelectric transformer, the power transmission efficiency can become higher. Using laminate techniques, prior TMPTs have had poor parallel precision and planeness which resulted in a low mechanical quality factor and lower power transmission efficiency.

In the present invention, a typically metallic end-mass is bonded to the output portion of a TMPT. This bonding may be viewed as adding additional mass to the ends of a TMPT or as replacing some or all of the ceramic in an output portion of a TMPT. Adding an end-mass to the output portion of the TMPT can increase the total mass and/or volume of the TMPT. An end-mass may be used to replace a portion of output ceramic and depending on the density of the end-mass that replaces the ceramic, the total volume of the TMPT can remain the same while the mass decreases (with a less dense end-mass) or increases (with the denser end-mass). Alternatively, an end-mass may be used to replace a portion of output ceramic and the total mass of the TMPT may remain the same while the volume or length of the TMPT increases (with a less dense end-mass) or decreases (with a denser end-mass). These examples are only illustrative of the effect of different density end-masses added to or replacing a part of the output ceramic of the TMPT and it is not necessary for either the mass or volume of the TMPT to remain constant.

In the preferred embodiment of the TMPT 110B, a denser end-mass is added to the output portion of the TMPT 110B, increasing both the mass and volume of the TMPT 110B. An increase in the mass of the TMPT 110B as well as a length increase lowers the resonant frequency of the TMPT 110B while increasing the gain and power density. The increase in gain is due to the fact that the added mass increases the momentum of the device without adding any ceramic layers (which add to the capacitance and dielectric losses). The increase in gain without adding ceramic layers results in a higher power to volume ratio. Furthermore the length of the end-mass(es) may be selected to ensure that during operation of the TMPT 110B, maximum compressive and tensile forces are concentrated at the bond line 56 and 58 between the input and output portion(s), resulting in increased gain. Further, since the metallic end-masses have a high mechanical quality factor, the gain and power density increase commensurate with increased mechanical quality factor of the composite TMPT 110B. Furthermore, the cost of the TMPT 110B is reduced due to the availability of inexpensive metal layers to replace the more expensive ceramic layers, and the ease of bonding metal end-masses to ceramic layers as opposed to the expense of conventional laminated multilayer manufacturing techniques.

Referring again to FIGS. 3 and 4, another piezoelectric transformer used in the circuits of the present invention, is a Thickness Mode Piezoelectric Transformer (TMPT) manufactured by stacking and bonding together a number of laminate layers. The end-mass tuned TMPT 110B has an input portion 31 and two output portions 32 and 33. The input portion 31 of the TMPT 110B comprises two layers 40 and 45 of piezoelectric ceramic separated by an electrode 47. Each of the two input layers 40 and 45 preferably comprises a layer of PZT material with electrodes (silver and/or nickel) electro-deposited thereon. The input layers 40 and 45 are polarized in the thickness direction, i.e., in the direction perpendicular to the major faces. Preferably the direction of polarization of one input layer e.g., 40 is opposite to the direction of polarization of the other input layer e.g., 45.

The two input layers 40 and 45 are each bonded along one of their major faces to a central electrode 47. The central electrode 47 preferably comprises a copper foil. On the remaining major faces of the input layers 40 and 45 are also bonded electrodes 46 and 48, also preferably comprising copper foil. Bonding of the input layers 40 and 45 to the electrodes 46, 47 and 48 is preferably with "Cibageigy AV118" (CIBA) as manufactured by Ciba Specialty Chemicals Corporation, N.A. of East Lansing, Mich.

The first and second output portions 32 and 33 of the TMPT 110B also comprise piezoelectric ceramic layers 50 and 55. Each of the output layers 50 and 55 also preferably comprise a layer of PZT with electrode material (silver and/or nickel) electro-deposited on their major faces. The output layers 50 and 55 are of substantially the same cross-section as the input layers 40 and 45, but are significantly thicker than the input layers 40 and 45 in the direction of its polarization. One major face of each output layer 50 and 55 is bonded to an outboard 44 and 46 electrode of the input portion 31, preferably using CIBA adhesive. To the remaining major face of each output layer 50 and 55 may be bonded (preferably using CIBA adhesive) another electrode 51 and 52, preferably comprising a copper foil. It is preferred that the input layers 40 and 45 be substantially equal in thickness and that the output layers 50 and 55 also be substantially equal in thickness. The equal thickness of the input layers 40 and 45 and of the output layers 50 and 55 allows the resonant characteristics of the device to be more uniform and predictable as well as minimizes the profile of the device.

The output layers 50 and 55 are also polarized, the direction of polarization of the output layers 50 and 55 being the thickness direction. Preferably each output layer 50 and 55 is polarized in the direction away from the center electrode 47 of the input. portion 31, i.e., the output layers 50 and 55 are preferably polarized in the thickness direction toward their respective outboard electrodes 51 and 52.

On each outboard side of the device (i.e., to the exterior electrodes 51 and 52) is bonded an end-mass 60 and 65 (preferably with CIBA adhesive). The end-masses 60 and 65 are preferably metallic (such as aluminum or steel) and of substantially the same cross-section as the input and output layers 40, 45, 50 and 55. Although the end-masses 60 and 65, and the input and output layers 40, 45, 50 and 55 may all be of different cross-section, is preferred that they are all of the same cross-section. This allows the resonant characteristics of the device to be more uniform and predictable as well as minimizes the profile of the device. The end-masses 60 and 65 that are bonded to the output portions 32 and 33 of the TMPT 110B are also of substantially the same thickness, which allows the resonant characteristics of the device to be more uniform and predictable as well as minimizes the profile of the device.

The thickness of the end-mass is chosen dependent on the type of material used for the end-mass and the resonant characteristics desired from the composite TMPT 110B. In most cases, the preferred end-mass 60 and 65 will be steel, because it is denser than PZT and the profile of a TMPT 110B may be minimized using a denser end-mass 60 and 65. When the end-masses 60 and 65 replace a portion of the output ceramic and the mass of the device is required to remain constant and the end-masses 60 and 65 are chosen to be aluminum, the thickness of the first and second end-mounted masses 60 and 65 are each 1.64 times the thickness of the output ceramic disks that each of the end-masses 60 and 65 replaces. When the end-masses 60 and 65 are chosen to comprise another material, such as steel, the ratio will depend on the physical properties (such as the density and dimensions) of the material and what total mass or volume device is desired.

It will be understood that because the TMPT 110B is polarized in the thickness direction, that the shape of the cross-section the TMPT (perpendicular to the thickness) does not affect the thickness vibration of the TMPT 110B. Thus, the TMPT 110B will operate according to the same principles whether the cross-section (perpendicular to the thickness) is square, rectangular, cylindrical or any other shape.

Referring to FIG. 3: As an example of the dimensions of a TMPT 110B in a cylindrical configuration, the input portion 31 of the device may comprise two PZT disks 40 and 45 each with a diameter of 0.75 inches and 0.03 inches thick. The output portions 32 and 33 may comprise PZT disks 50 and 55 each with a diameter of 0.75 inches and a thickness of 0.60 inches. Copper foil 46, 47, 48 and 52 is bonded to each major face of the disks 40, 45, 50 and 55 comprising the input and output portions 31, 32 and 33. To the output portions 32 and 33 are bonded aluminum cylinders 60 and 65 each with a diameter of 0.75 inches and a thickness of 0.656 inches.

Referring to FIG. 4: A preferred configuration of a TMPT 110B is illustrated in which multiple layers of piezoelectric material with end-masses are bonded together and configured as a rectangular bar. In the center of the device is the input portion 31 comprising two layers 40 and 45 of piezoelectric ceramic material (preferably PZT) bonded to a central electrode 47 and two outboard electrodes 46 and 48. To the two outboard electrodes 46 and 48 of the input portion 31 are bonded two output ceramic layers 50 and 55 (preferably PZT). To the outboard sides of the output ceramic layers 50 and 55 are bonded end-masses 60 and 65. In the case of the TMPT 110B of FIG. 4, the end-masses 60 and 65 comprise a conductive material such as steel, and the need for additional electrodes on the outboard sides of the output ceramic layers 50 and 55 is thus obviated. A rectangular slab shaped TMPT 110B was constructed having an input portion 31 comprising two input PZT ceramic layers 40 and 45 that are 0.39 by 0.10 by 0.030 inches thick with a central electrode 47 and outboard electrodes 46 and 48 comprising 3 mil thick copper foil. The output portions 32 and 33 comprises two output PZT ceramic layers 50 and 55 that are 0.39 by 0.10 by 0.40 inches thick bonded to the outboard electrodes 46 and 48 of the input portion 31. The end-masses 60 and 65 comprises layers of steel 0.39 by 0.10 by 0.20 inches thick bonded to the outboard sides of the output portions 50 and 55. These measurements are only illustrative of the dimensions of one embodiment of the invention, and many other embodiments are possible depending on the size, frequency and gain of the desired application. The ceramic layers 40 and 45 of the input portion 31 are both polarized in the thickness direction and preferably are polarized towards the center electrode 47 as indicated by the arrows. The ceramic layers 50 and 55 of the output portions 32 and 33 are also both polarized in the thickness direction and preferably are polarized away from the center electrode 47 towards the end-mass 60 and 65 on the same side as the respective output portion 32 and 33 as indicated by the arrows.

FIG. 4 depicts the preferred embodiment of the invention in a rectangular slab shaped configuration as well the preferred embodiment of the connection for electrical leads in order to achieve a significant voltage gain. In the preferred embodiment of the invention, the center electrode 47 is a ground connection, and the outboard electrodes 46 and 48 are both connected to input terminal 71. The output voltage from the TMPT 110B is taken across output terminals 72 and 73 connected to electrode/end-masses 65 and 60 respectively. In the embodiment depicted in FIG. 7 and constructed with the dimensions listed hereinabove, the TMPT 110B had a resonant frequency of 53.7 kHz and achieved voltage gains of 19.8.

Referring again to FIG. 4: In operation, a voltage of a first polarity is applied to input terminal 71 connected to outboard electrodes 46 and 48. This voltage causes input ceramic layers 40 and 45 to piezoelectrically contract in the thickness direction (i.e. a d33 mode deformation parallel to the direction of polarization of the layers 46 and 48). When a voltage of an, opposite polarity is applied to input terminal 71 connected to outboard electrodes 46 and 48, the applied voltage causes input ceramic layers 40 and 45 to piezoelectrically expand in the thickness direction (i.e. also a d33 mode deformation parallel to the direction of polarization of the layers 46 and 48). Thus, by applying an alternating voltage at a given frequency to the input portion 31 of the TMPT 110B the ceramic layers 40 and 45 cyclically expand and contract (a d33 mode thickness vibration) at the frequency of the applied alternating voltage.

As the ceramic layers 40 and 45 of the input portion 31 of the TMPT 110B expand, the output portions 32 and 33 travel outwardly from the bond lines 56 and 58 along with the securely bonded input portion 31. Conversely, as the ceramic layers 40 and 45 of the input portion 31 of the TMPT 110B contract, the output portions 32 and 33 travel inwardly from the bond lines 56 and 58 along with the securely bonded input portion 31. When the polarity of the voltage applied to the ceramic layers 40 and 45 of the input portion 31 is reversed, the direction of expansion or contraction of the ceramic layers 40 and 45 almost instantaneously reverses. The direction of movement of the output portions 32 and 33 does not change as quickly. Like a mass-spring system, the momentum of the output portions 32 and 33 and end-masses 60 and 65 causes them to continue travelling further in their original direction of movement (thereby causing the ceramic layers 50 and 55 to expand or contract) before changing direction to move in same the direction as the input portion 31. Thus, the movement and changes of direction (vibration) of the input portion 31 causes the output portions 32 and 33 to deform (due to inertia) in the thickness direction, also vibrating at or near the drive frequency of the voltage applied to the input portion 31. Thus, the d33 mode thickness vibration of the input portion 31 causes a g33 mode thickness vibration in the output portions 32 and 33, and an alternating voltage is piezoelectrically generated across the electrodes 60 and 65 of the output portions 32 and 33.

If the frequency applied to the input portion 31 is chosen to correspond to the natural resonant frequency of the TMPT 110B (in the thickness direction along the length of the TMPT 110B), higher deformation in the output of the device and higher gains may be realized. Thus, a TMPT 110B will realize its highest gains operating at resonance. The resonant frequency of the TMPT 110B depends not only on the length of the device (relative to the wavelength of the applied frequency), but also the mass of the device, including the end-masses 60 and 65. The resonant frequency also varies with the length and mass of each individual output layer 50 or 55 and its ratio of length and mass to its respective end-mass 60 or 65. Bonding the end-masses 60 and 65 to the output portions of the TMPT 110B increases the length and the mass of the TMPT 110B and therefore lowers the resonant frequency of the device. The length and mass of the end-masses 60 and 65 can also be chosen to increase the momentum of the output portions 32 and 33 while concentrating the compressive and tensile forces about the bondlines 56 and 58 between the input portion 31 and output portions 32 and 33. Increasing these compressive and tensile forces also increases the gain realized in the TMPT 110B. The increased mass and momentum of the TMPT 110B is accomplished by adding the end-masses 60 and 65 that are denser than the output ceramic and not by adding additional ceramic layers to the device. By eliminating the need for additional output ceramic layers, capacitive and dielectric losses are reduced, and the achievable gain of the device increases. The end-masses 60 and 65 further reduce dissipative losses by allowing the TMPT 110B to operate at a lower frequency which reduces the heat generated by the device (heat which can increase dielectric losses). Furthermore, because the end-masses 60 and 65 are typically chosen to be metallic, the end-masses 60 and 65 act as heat sinks which absorb and dissipate the heat generated in the ceramic layers 50 and 55, and further reduce dielectric losses due to heat.

Figure 10:
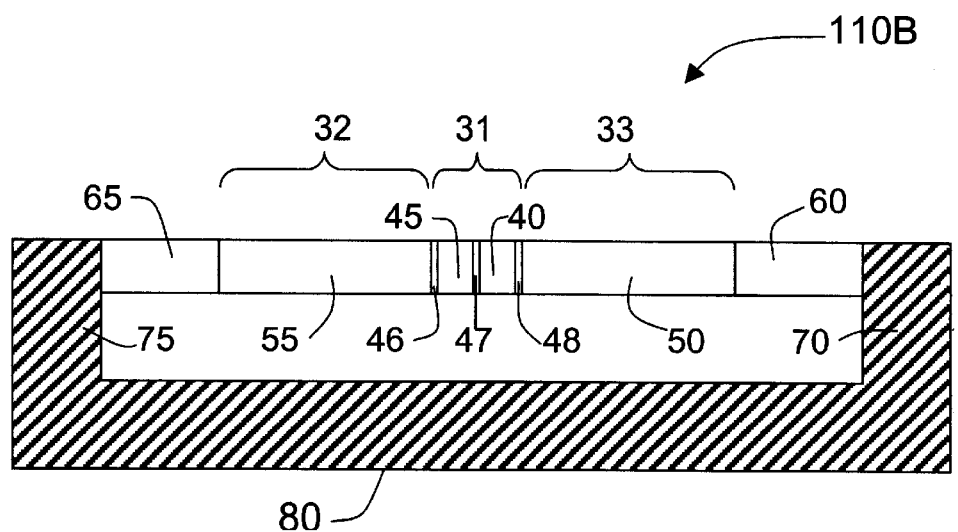
FIG. 10 is a side view of a mounting apparatus incorporating the thickness mode piezoelectric transformer of FIG. 4 and subjecting it to a compressive stress.

Referring to FIG. 10: The TMPT 110B may further be modified and increased gain can be achieved by subjecting the TMPT 110B to a compressive stress. Applying a compressive force to the ceramic layers 40, 45, 50 and 55 of the TMPT 110B extends the mechanical limits of deformation for the composite device. As illustrated in FIG. 10, the TMPT of FIG. 4 may be placed in a mounting device 80 that contacts and presses inwardly against the end-masses 60 and 65 of the TMPT 110B. As the TMPT 110B contracts and expands, the walls 70 and 75 of the mounting device 80 maintain a compressive force against the ends 60 and 65 of the TMPT 110B. By maintaining a compressive force on the TMPT 110B, the tensile forces acting upon it are reduced. Since a TMPT 110B not under compression is most likely to fail in tension, the application of a compressive force, which reduces the tensile force, allows the TMPT 110B to operate at higher stresses without being strained to the point of mechanical failure. Because the mechanical limits of performance of the prestressed TMPT 110B are higher, the TMPT 110B can operate under compression at higher voltages and greater stresses, thereby providing increased gain.

The TMPTs illustrated in FIGS. 3, 4 and 10 also provide greater power density, and therefore greater power transmission efficiency than prior devices. In the present invention, the end-masses 60 and 65 (typically metal having a high mechanical quality factor (Q)) are bonded to the output portions 50 and 55 of a TMPT 110B to augment or replace some or all of the ceramic in the output portions 32 and 33. By increasing the mechanical quality factor of the composite piezoelectric transformer, the gain and power transmission efficiency can become higher. The increase in gain is due to the fact that the additional mass increases the momentum of the device without adding ceramic layers (which would add to capacitance and dielectric losses). The increase in gain using less ceramic layers results in a higher power to volume ratio. Also, since the end-masses augment replace a some or all of an output ceramic layer, and the metallic end-masses have a higher mechanical quality factor than the ceramic they augment or replace, a higher gain is realized with less ceramic, and the power density of the composite TMPT 110B increases. Furthermore, when the end-masses are chosen to be a material (like steel) that is denser than the ceramic, a TMPT 110B of a given size may be constructed that has greater mass (than its all ceramic counterpart) and therefore a lower resonant frequency of operation. The greater mass for a given size TMPT 110B also provides greater momentum and therefore generates higher voltage gains as well as increased power handling capacity.

It will be understood that the TMPT 110B may be modified to isolate the input voltage from the output voltage, just as in the piezoelectric transformer of FIG. 2, by placing a dielectric layer and an additional output electrode between each input electrode 46 and 48, and their respective output portions 32 and 33. For simplicity of illustration in FIGS. 5–7, the above described transformers 110 and 110B, which do not have an isolation layer are labeled in FIGS. 5 through 7 as transformer 10 with input and output portions 1A and 1B respectively. Also, for simplicity of illustration, the above described transformers 110A and 110B, which have an isolation layer are labeled in FIGS. 5 through 7 as transformer 10A with input and output portions 1A and 1B respectively on either side of the isolation layer.

Figure 5:
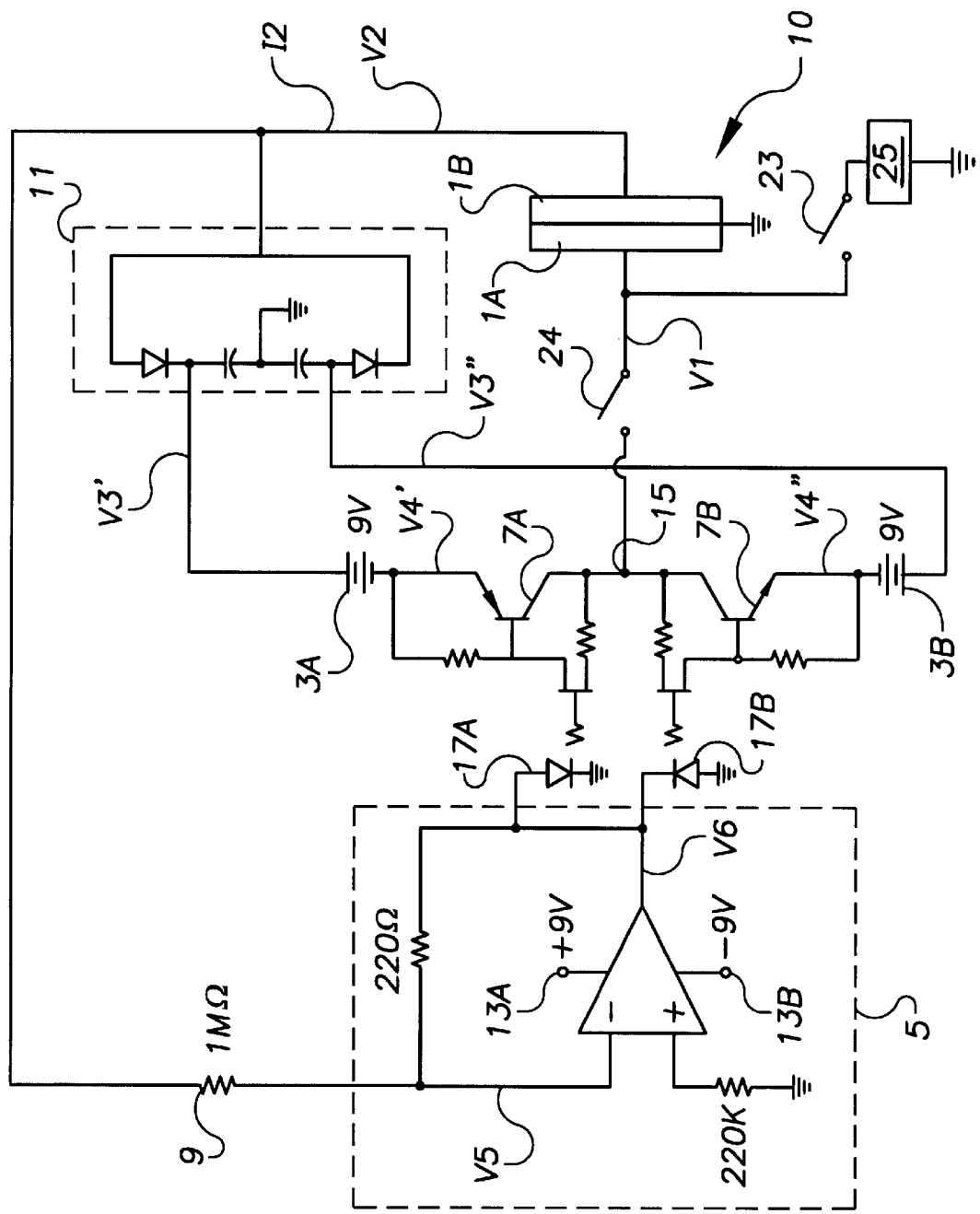
FIG. 5 is a schematic diagram of a positive feedback circuit capable of producing an audible or ultrasonic signal as described using a continuous wave input.

Referring now to FIG. 5 which is a schematic of one circuit of the present invention, a piezoelectric transformer 10 of the type just described is caused to oscillate by two, in this case 9 volt, batteries 3A and 3B. This voltage V1 applied to the primary input portion 1A of the piezoelectric transformer 10 causes the piezoelectric transformer 10 to longitudinally deform) as just described. As seen from FIG. 5, this voltage V1 is stepped up as it is transferred to the output portion 1B of the piezoelectric transformer 10. The stepped-up voltage V2 is then applied to a rectifier-capacitor array 11 that effectively doubles the magnitude of its input voltage V2. The design and assembly of rectifier-capacitor arrays as depicted at 11 is well known in the art. The output voltage V3 from rectifier-capacitor array 11 is sequentially applied to batteries 3A and 3B. Input voltage V3 to batteries 3A and 3B is added to each battery's voltage to produce a battery output voltage V4. Voltage V4 is then applied to power transistors 7a and 7b.

Voltage output V2 from the secondary output side 1B of piezoelectric transformer 10, in addition to being applied to rectifier-capacitor array 11, is also applied to resistor 9 which drops the voltage V2 down to a reduced voltage V5 which is in turn applied to and necessary to operate operational amplifier ("op-amp") 5. Typically, to obtain the required voltage drop, resistor 9 is on the order of at least about 1 meg-ohm. In compliance with Ohm's Law, the majority of the current I2 resulting from the application of voltage V2 is forced through rectifier-capacitor array 11 rather than through resistor 9. Only sufficient current need be passed through resistor 9 as to power op-amp 5. Nine volt power source 13A/13B is provided for the initial operation of op-amp 5. Op-amp 5 produces a voltage V6 that is of opposite polarity from voltage V5. Voltage V6 is applied as the input to optocouplers 17A and 17B. Optocouplers 17A and 17B serve to isolate high voltage V1 from low voltage VS that is necessary to operate op-amp 5. Depending on the polarity of voltage V6, it (voltage V6) is applied to either power transistor 7a or 7b. When voltage V6 is applied to either power transistor 7a or 7b, the corresponding power transistor (7A or 7B) is activated, resulting in voltage V4 at terminal 15. For any given half cycle of operation of this circuit, the voltage at terminal 15 will temporarily and instantaneously be of opposite polarity from voltage V1. Thereafter, for the next half cycle, V1 will assume the value and polarity of V4.

The cycling of stepped-up voltage V2 from secondary side 1B back to primary side 1A of transformer 10 is continuous so long as the circuit is not interrupted. Eventually the system reaches steady state, the transducer stepping up incoming voltage V1 at a reduced level as the impedance of the circuit increases, and the 9 volt batteries 3A and 3B compensate for any losses in the system. Typically, the time necessary for operation to reach steady state is a few cycles or enough time for the circuit to generate sufficient current to charge the capacitors of rectifier-capacitor array 11.

Activation of the circuit is controlled by the closing of switch 24. As will be recognized by the skilled artisan, switch 24 can be placed at any number of positions within the circuit, and its location as shown is merely a matter of convenience. Activation of switch 24 can be achieved due any of a number of causes, but is most generally accomplished in response to a signal from a sensor of one sort or another, for example a heat or smoke detector in the case of a fire alarm.

As the skilled artisan will recognize, batteries 3A and 3B can, of course, be replaced with a single power source. It will also be recognized that the circuit can be used to drive a resonating high voltage transformer 10 with a relatively low voltage power supply such as a battery.

As shown in FIG. 5, a portion of the electrical energy at terminal 15 (i.e. at voltage V1) can be conducted from the positive feedback amplifier circuit to power an auxiliary device 25, while the complement of same is conducted to the primary side 1A of the transformer 10. Actuation of auxiliary device 25 is caused by the closing of switch 23. According to a preferred embodiment of the present invention, auxiliary device 25 is a piezoelectric actuator which can in turn upon actuation by voltage V1 produce mechanical motion for purposes of producing sound or vibration, or inducing other appropriate mechanical or vibratory motion.

Voltage V1 may be rectified or not depending upon the energy requirements of auxiliary device 25. Design and installation of an appropriate rectifier circuit to accomplish this are well within the capabilities of the skilled artisan.

Figure 8:
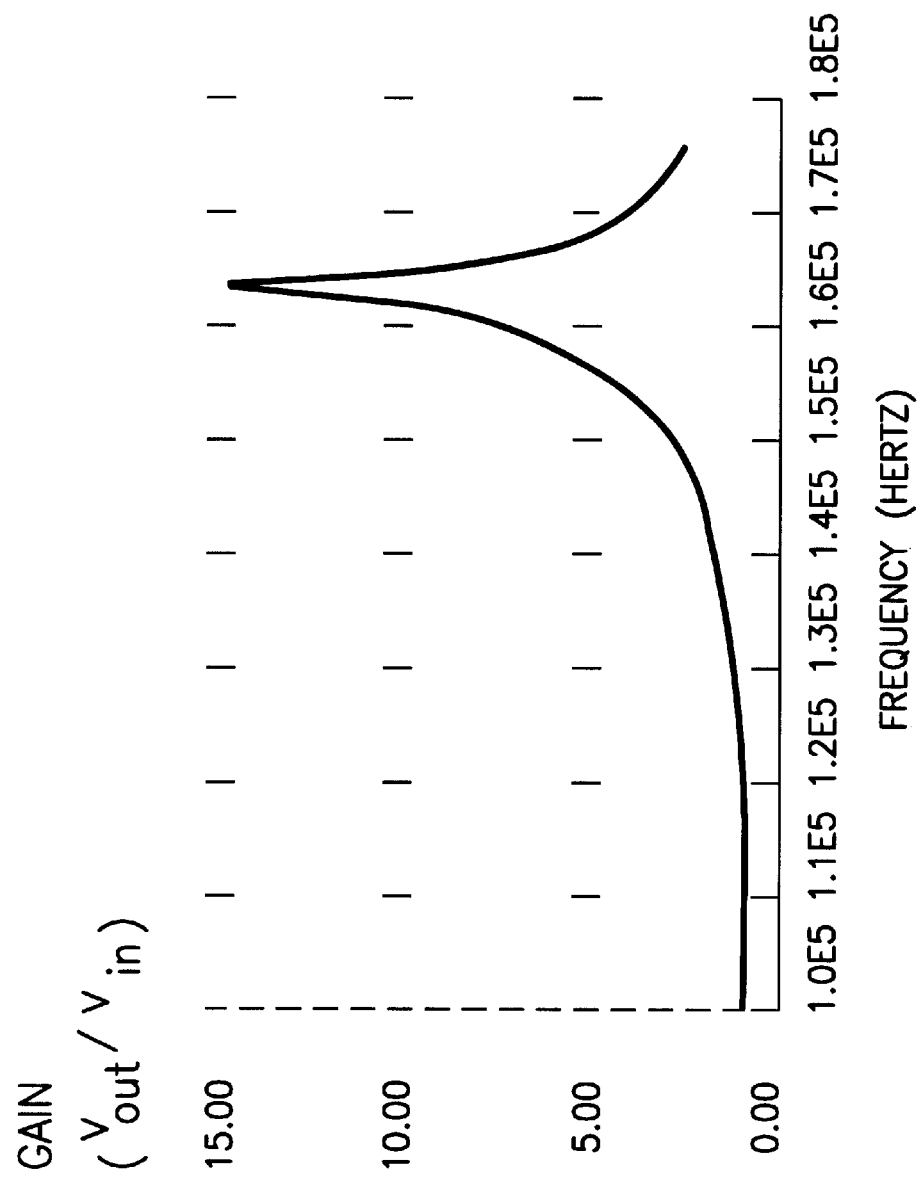
FIG. 8 is a graph of gain versus frequency for the transformer shown in FIG. 2 and demonstrating the highest gain at resonance.

FIG. 8 shows a graph of voltage gain versus impedance for a typical laminated transformer of the type in FIGS. 1 and 2. In this case, resonance, and hence maximum gain occurs at a frequency of about 16.3 kilohertz. The gain (i.e. the ratio of output voltage V2 to input voltage V1) measured at this frequency was about 14.5. From this graph (FIG. 8), it is also apparent that as the operating frequency of the transformer changes, the gain that is realized decreases. It will be appreciated that the resonant frequency, i.e. the frequency at which the transformer 10 naturally tends to vibrate when physically disturbed, corresponds to the frequency at which the transformer 10 is capable of generating the highest voltage gain.

Figure 9:
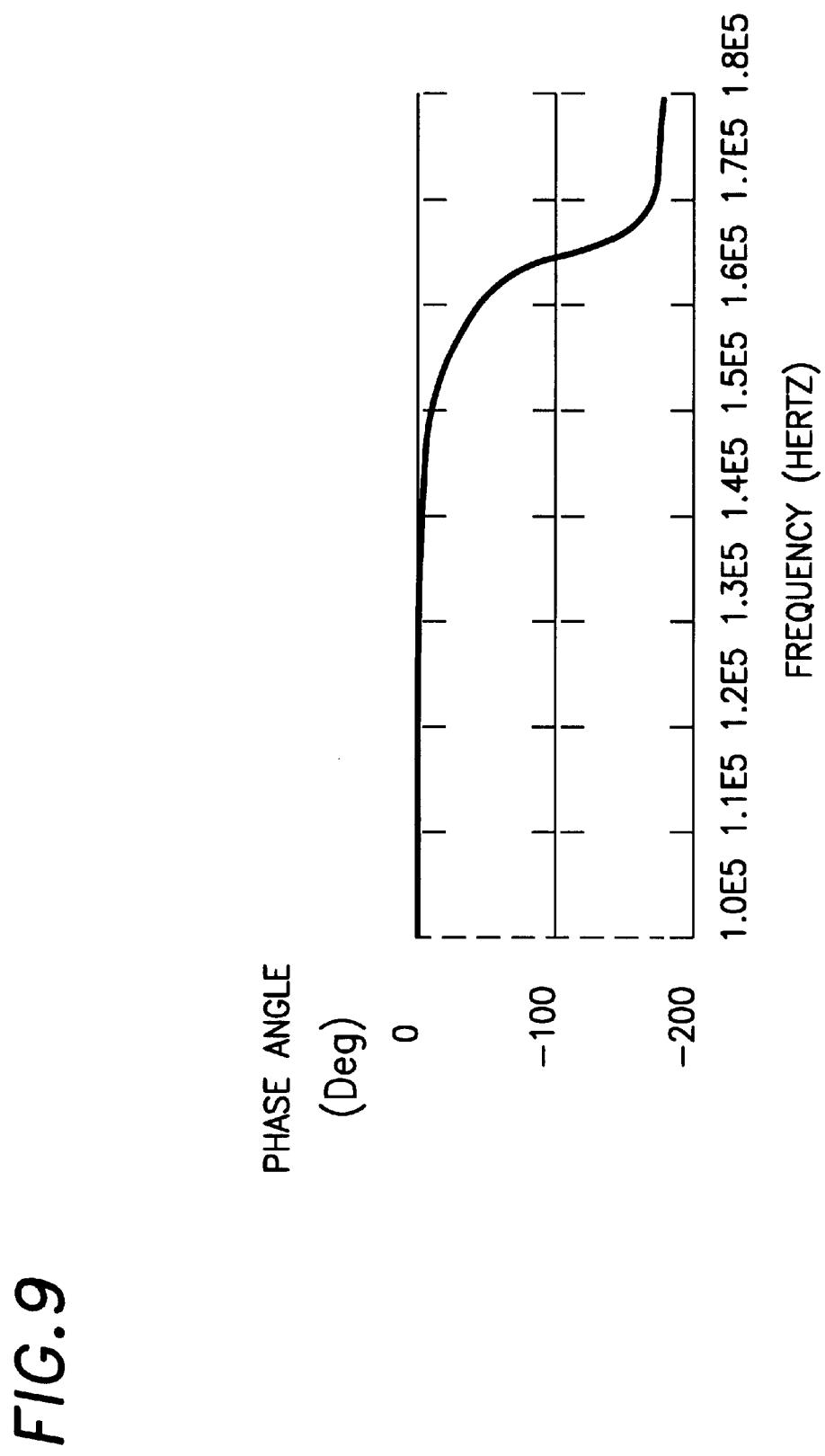
FIG. 9 is a graph phase angle versus frequency for the transformer shown in FIG. 2 and demonstrating the phase shift about resonance.

In certain embodiments of the present invention there occurs an inherent phase shift between the primary 1A and secondary 1B sides of the transformer 10. FIG. 9 illustrates the phase angle relationship between input and output voltages of a particular construction of transformer at different input frequencies. In particular, as illustrated in FIG. 9, there is a phase angle difference of approximately −90 degrees at resonant frequency. In order to efficiently operate such a transformer at its resonant frequency, it is useful to include phase shifting circuitry in order to maintain the supplemented input voltage to the primary side 1A of the transformer 10 in the desired phase relationship with the output voltage at the secondary side 1B of the transformer 10. Design and installation of appropriate phase shifting circuitry to accomplish this are well within the capabilities of the skilled artisan.

Figure 6:
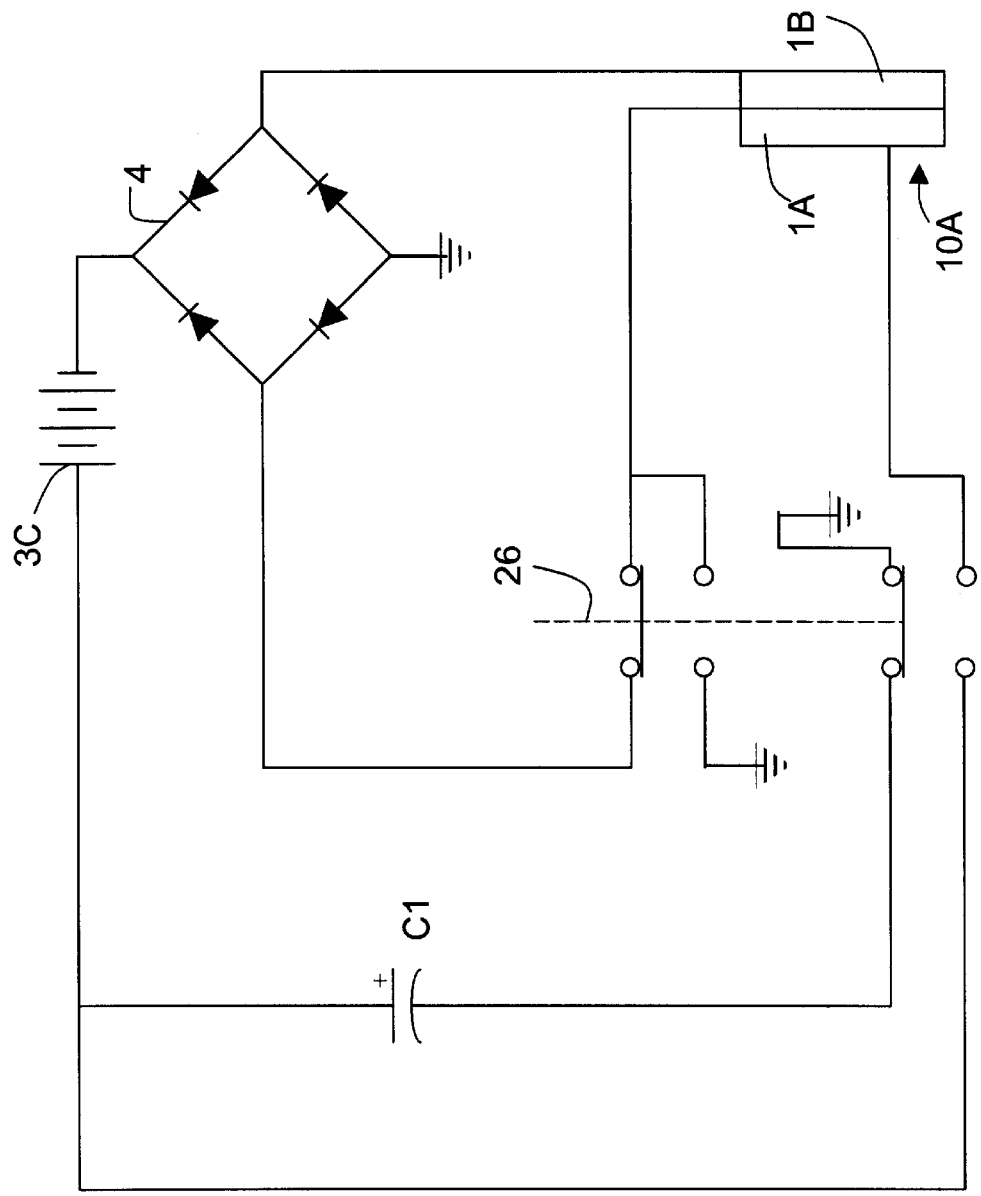
FIG. 6 is a schematic diagram of the positive feedback circuit of the present invention using a pulsed input.

FIG. 6 shows a schematic of a circuit incorporating the above transformers and operating in a pulsed mode. In this embodiment of the circuit, the process is not continuous, but rather has alternating capacitor discharge and recharge cycles. The pulse mode circuit operates with relatively higher power levels than a continuous wave since the energy does not continuously circulate through the transformer 10A and battery 3C. Rather, it is stored in a capacitor C1 and is periodically discharged to the transformer 10A. The transformer 10A, through the battery 3C, provides power to the capacitor C1 during the recharge cycle, and then the capacitor C1 transfers that power back to the transformer 10A during the discharge cycle.

In the circuit of FIG. 6, a voltage pulse is applied to the input side 1A of the transformer 10A by closing a momentary switch 26. With the storage capacitor C1 charged to the appropriate level, when the momentary switch 26 is closed, the capacitor discharges, sending a voltage pulse into the primary side 1A of the transformer 10A. This pulse of energy makes the transformer 10A oscillate at its natural resonant frequency, creating an oscillating output voltage across the secondary output side 1B of the transformer 10A. Because the applied voltage is not continuous but is pulsed, the transformer 10A will resonate with a greater magnitude immediately after the pulse is first applied, and the magnitude of the oscillation will diminish slightly each cycle. The magnitude and duration of the resonant oscillations depends on the dimensions and the material properties of the transformer 10A as well as the magnitude and duration of the applied pulse.

As the transformer 10A resonates, an alternating AC output voltage is generated at the secondary side 1B of the transformer 10A and is applied to a rectifier array 4 for the duration (corresponding to a number of cycles) of the output signal. The rectifier array 4 rectifies the alternating high voltage AC signal into an oscillating high voltage DC signal. A low makeup voltage of the battery 3C is added to the rectified high voltage signal to charge the capacitor C1.

When the momentary switch 26 is again depressed or triggered, the capacitor C1 again discharges, applying another voltage pulse to the input side 1A of the transformer 10A.

Figure 7:
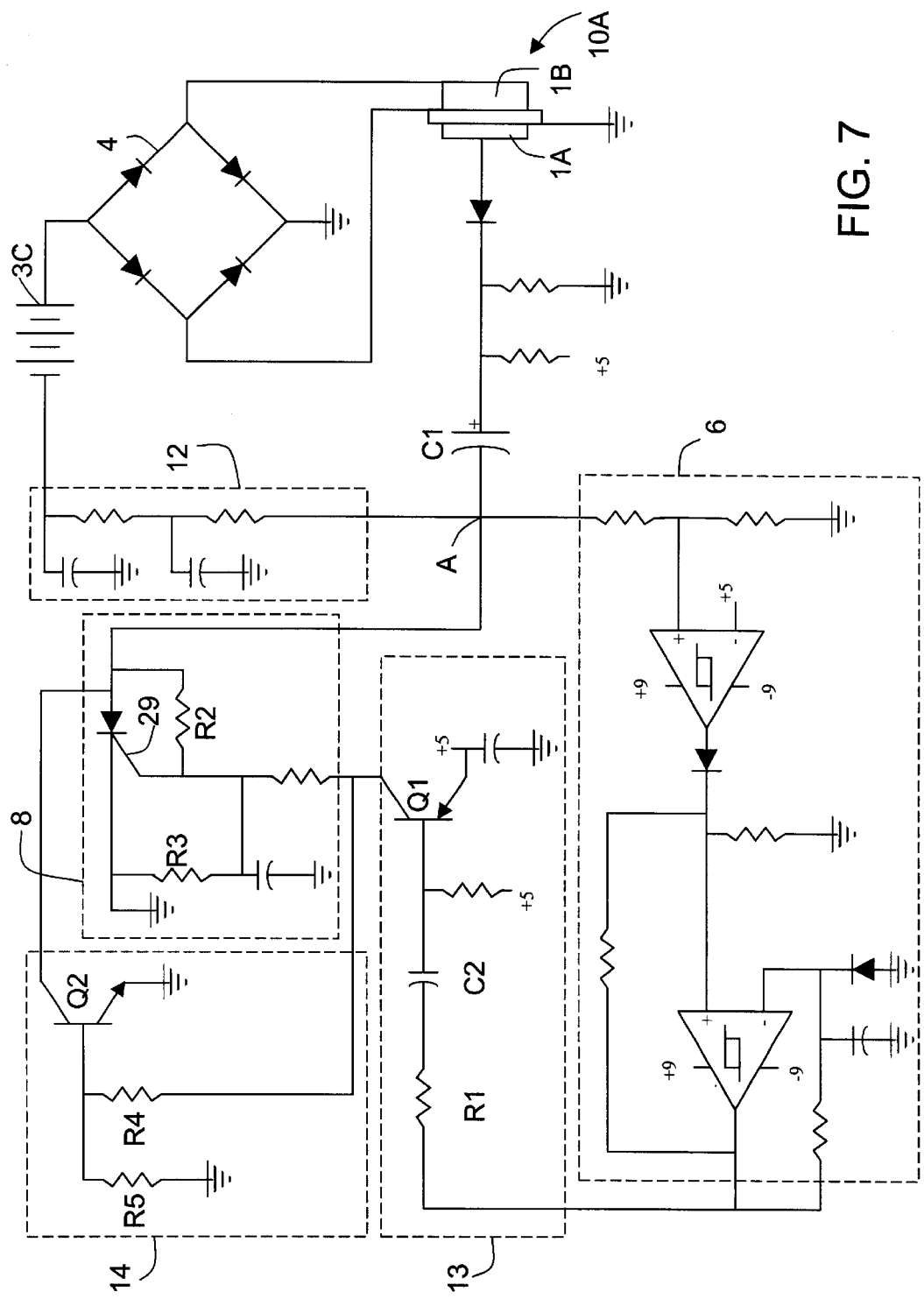
FIG. 7 is a more detailed schematic diagram of the positive feedback circuit of the present invention using a pulsed input.

FIG. 7 shows a more detailed configuration of the circuit in FIG. 6. In this circuit, the momentary switch 26 has been replaced by a comparator or trigger switch 6, which senses the DC voltage at the input of the storage capacitor C1 and triggers the opening of the gate of an SCR 29. When the SCR 29 gate opens, connecting the storage capacitor C1 to ground, the capacitor C1 discharges through the SCR 29 sending a negative voltage pulse to the input side 1A of the transformer 10A, thereby making the transformer 10A resonate.

More specifically, the output electrodes on the output side 1B of the transformer 10A are connected to a rectifier array 4 which rectifies the alternating high voltage AC signal into an oscillating high voltage DC signal. The high voltage DC signal (which may typically be in the range of 191 volts) passes through the low voltage battery 3C (in the range of 9 volts) to yield a augmented high voltage DC signal. This signal passes through noise filter 12 before reaching and charging the storage capacitor C1 up to preferably about 200 volts.

The trigger circuit 6 preferably comprises a comparator with hysteresis such as a Schmitt trigger. The input side of the trigger circuit 6 is connected to junction A where the voltage is equal to the augmented high voltage DC signal at the input to the storage capacitor C1. The magnitude of this signal is indicative of where the transformer 10A is in its resonant cycle, and therefore how much voltage has been applied to and stored by the capacitor C1. As the transformer 10A resonates, the magnitude of the augmented high voltage DC signal decreases over time. When the augmented high voltage DC signal decreases to a predetermined magnitude, the trigger circuit 6 generates a trigger signal. The trigger circuit 6 preferably generates the trigger signal at the most efficient time to apply a voltage pulse to the resonating transformer 10A. Although the trigger circuit 6 may generate the trigger signal in response to a sensed voltage, the trigger signal may also be generated in response to a sensed number of resonant cycles of the transformer 10A or after a predetermined duration of time equivalent to that number of cycles.

The trigger circuit 6 generates a trigger signal comprising a voltage pulse with hysteresis. This pulse is input into an SCR trigger circuit 13. The SCR trigger circuit preferably comprises a resistor R1, a blocking capacitor C2 and a transistor Q1 in series. The trigger signal from the trigger circuit charges the blocking capacitor C2 and when the trigger signal abruptly goes to zero, the capacitor C2 discharges pulling open the gate (base) of the transistor Q1. The transistor Q1 has a positive voltage bias on the collector, and the emitter is connected to the gate of an SCR 29.

When the gate of the transistor opens, the positive bias of the transistor Q1 pulls open the gate of the SCR 29. An SCR bias circuit 8 comprises resistors R2 and R3 in parallel with the SCR 29, and prevent the gate from opening at the wrong time. More specifically, the SCR bias circuit 8 comprises resistor R2 in parallel with the gate and anode of the SCR 29 and resistor R3 in parallel with the gate and cathode of the SCR 29. When the gate of the SCR 29 opens, the voltage at junction A goes to zero because it is connected to ground through the open gate of the SCR 29. Since the storage capacitor C1 is also connected to ground when the gate of the SCR 29 opens, the capacitor C1 discharges (at least partially) through the gate of the SCR 29 to ground. The discharging of the capacitor C1 to ground is seen at the input side 1A of the transformer 10A as a negative voltage pulse, which makes the transformer 10A once again resonate. A transistor Q2 and resistors R4 and R5 in parallel with the SCR bias circuit 8 form a capacitor discharge recovery circuit 14. The capacitor discharge recovery circuit 14 forms a conduit by which the storage capacitor C1 may recover the unused portion of its discharge, when the gate of the SCR closes.

The circuit may also comprise a startup circuit to initially charge the capacitor with a high enough voltage for the first pulsed input. Alternative the startup circuit may also comprise an auxiliary subcircuit for applying a first high voltage pulse to the input side 1A of the transformer 10A.

Since the circuit just described is assembled from generally well-known and readily available low or moderate cost components of relatively small size, it is optimally suited for use in small appliances or tools such electric razors, toothbrushes, smoke detectors, etc.

Typically, the human range of hearing falls between 500 and 20,000 hertz. Selection of a transformer 10 that resonates within this range will result in a horn or alarm which emits an audible signal when the circuit is actuated. Selection of a transformer that resonates outside of this range will produce an ultrasonic emitter whose energy can be used with attachments or tools that require vibration at a specified frequency such as a razor, scalpel, oscillating toothbrush etc., such oscillation being provided by the voltage induced movement of piezoelectric resonant transducer or transformer 10 or 10A.

While preferred embodiments of the invention have been shown and described, various modifications and substitutions may be made thereto without departing from the spirit and scope of the invention. Accordingly, it is to be understood that the present invention has been described by way of illustration, and that the scope of the invention is intended to be limited only by the scope of the appended claims.

What is claimed is:

1. A positive feedback amplifier circuit comprising:
    a transformer having an input side and an output side;
    a rectifier array having an input side and an output side, said input side of said rectifier array being electrically connected to said output side of said transformer;
    a low voltage power source having an input side and an output side;
    a storage capacitor in series with said output side of said low voltage power source and said input side of said transformer;
    wherein an output of the rectifier array is applied and added to an output of said low voltage power source to provide a supplemented voltage to said storage capacitor;
    and further comprising a comparator subcircuit having an input side and an output side;
        an output signal at said output side of said comparator subcircuit being a voltage pulse;
    an SCR trigger subcircuit comprising a capacitor in series between a resistor and a transistor;
        said transistor having a base a collector and an emitter;
        said capacitor being connected to the base of said transistor; and
    said comparator subcircuit being connected in series between said low voltage power source and said SCR trigger subcircuit;
    an SCR having a gate, and an anode and a cathode;
        said gate being connected to said collector of said transistor;
        said anode being connected to said storage capacitor;
        said cathode being connected to ground.

2. The electrical circuit of claim 1 wherein said transformer is a laminated, multilayered, piezoelectric transducer.

3. The electrical circuit of claim 2 wherein said laminated, multilayered, piezoelectric transducer comprises a first polarized ceramic layer having two opposing major faces disposed on opposite sides of a first longitudinal axis, a second polarized ceramic layer having two major opposing faces which are disposed on opposite sides of a second longitudinal axis, said first and second longitudinal axes being parallel to each other;
    and wherein the first polarized ceramic wafer is bonded to the second polarized ceramic wafer such that a major face of the first polarized ceramic layer and a major face of the second polarized ceramic layer are in opposed spatial relation to each other;
    and wherein the direction of polarization of said first polarized ceramic layer and the direction of polarization of said second polarized ceramic layer are the same.

4. The electrical circuit of claim 3 wherein said transformer is a thickness mode piezoelectric transformer.

5. The electrical circuit of claim 3 wherein said transformer is a thickness mode piezoelectric transformer with masses bonded on opposing faces.

* * * * *